(12) United States Patent
Shinozaki et al.

(10) Patent No.: US 11,626,247 B2
(45) Date of Patent: Apr. 11, 2023

(54) ELECTRONIC COMPONENT, CIRCUIT BOARD ARRANGEMENT, AND METHOD OF MANUFACTURING ELECTRONIC COMPONENT

(71) Applicant: TAIYO YUDEN CO., LTD., Tokyo (JP)

(72) Inventors: Junichi Shinozaki, Tokyo (JP); Toshiki Kondo, Tokyo (JP); Ryosuke Hoshino, Tokyo (JP); Takahisa Fukuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1 day.

(21) Appl. No.: 17/458,144

(22) Filed: Aug. 26, 2021

(65) Prior Publication Data

US 2022/0068564 A1 Mar. 3, 2022

(30) Foreign Application Priority Data

Aug. 27, 2020 (JP) .............................. JP2020-143481

(51) Int. Cl.
| | |
|---|---|
| *H01G 4/232* | (2006.01) |
| *H01G 4/248* | (2006.01) |
| *H01G 4/12* | (2006.01) |
| *H05K 1/18* | (2006.01) |
| *H01G 4/30* | (2006.01) |

(52) U.S. Cl.
CPC ........... *H01G 4/232* (2013.01); *H01G 4/1209* (2013.01); *H01G 4/248* (2013.01); *H01G 4/30* (2013.01); *H05K 1/181* (2013.01); *H05K 2201/10015* (2013.01); *H05K 2201/10636* (2013.01)

(58) Field of Classification Search
CPC ........................................................ H01G 4/232
USPC ............................................................ 174/260
See application file for complete search history.

(56) References Cited

U.S. PATENT DOCUMENTS

| | | | |
|---|---|---|---|
| 6,344,963 B1 | 2/2002 | Mori | |
| 2015/0353781 A1* | 12/2015 | Namiki | ................. C23C 14/223 |
| | | | 205/164 |
| 2016/0149186 A1* | 5/2016 | Kim | ..................... H01M 50/449 |
| | | | 429/144 |
| 2016/0183346 A1* | 6/2016 | Hsing | .................. H05B 33/145 |
| | | | 362/293 |

FOREIGN PATENT DOCUMENTS

JP 2000-277371 A 10/2000

* cited by examiner

*Primary Examiner* — Stanley Tso
(74) *Attorney, Agent, or Firm* — Chen Yoshimura LLP

(57) ABSTRACT

An electronic component includes an element body and external electrodes. The element body includes a dielectric and an internal electrode. Each of the external electrodes includes a base layer formed on multiple surfaces of the element body and an electrically-conducting material layer formed on the base layer, the base layer including a metal and co-material particles dispersed in the metal and being connected to the internal electrode. The co-material particles at an interface surface between the base layer and the electrically-conducting material layer have edges covered with the metal at the interface surface. The electrically-conducting material layer is in contact with the co-material particles at the interface surface and the metal covering the edges of the co-material particles at the interface surface.

17 Claims, 10 Drawing Sheets

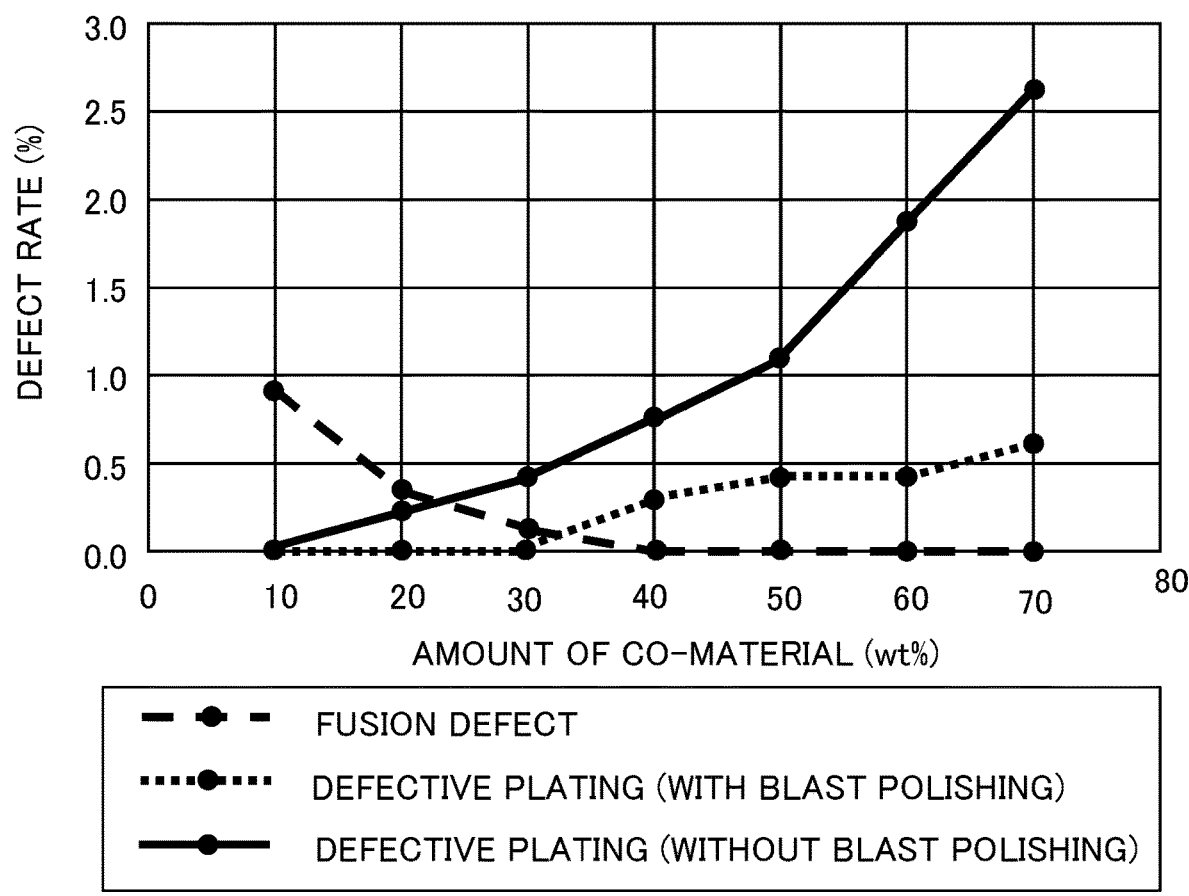

Fig. 10

| AMOUNT OF CO-MATERIAL IN BASE LAYER (wt%) | BLAST POLISHING | Ni LAYER COATING ON EDGE OF CO-MATERIAL PARTICLES ON INTERFACE SURFACE | RATIO OF TOTAL LENGTH OF CO-MATERIAL PARTICLES IN CONTACT WITH PLATING LAYER TO LENGTH OF INTERFACE SURFACE BETWEEN BASE LAYER AND PLATING LAYER | FUSION DEFECT RATE AFTER SINTERING | PLATING ADHESION FAILURE RATE |
|---|---|---|---|---|---|
| 10 | DONE | YES | 6% | 0.90% | 0.00% |
| 10 | NOT DONE | NO | 8% | 0.90% | 0.00% |
| 20 | DONE | YES | 11% | 0.28% | 0.00% |
| 20 | NOT DONE | NO | 16% | 0.28% | 0.20% |
| 30 | DONE | YES | 16% | 0.11% | 0.00% |
| 30 | NOT DONE | NO | 23% | 0.11% | 0.40% |
| 40 | DONE | YES | 21% | 0.00% | 0.30% |
| 40 | NOT DONE | NO | 30% | 0.00% | 0.70% |
| 50 | DONE | YES | 25% | 0.00% | 0.40% |
| 50 | NOT DONE | NO | 36% | 0.00% | 1.10% |
| 60 | DONE | YES | 29% | 0.00% | 0.40% |
| 60 | NOT DONE | NO | 41% | 0.00% | 1.90% |
| 70 | DONE | YES | 33% | 0.00% | 0.60% |
| 70 | NOT DONE | NO | 47% | 0.00% | 2.60% |

ELECTRONIC COMPONENT, CIRCUIT BOARD ARRANGEMENT, AND METHOD OF MANUFACTURING ELECTRONIC COMPONENT

TECHNICAL FIELD

The present invention relates to electronic components, circuit board arrangements, and methods of manufacturing electronic components.

RELATED ART

To reduce a mounting area of an electronic component with a demand for downsizing of an electronic device, an external electrode is often integrally formed on an element body in which an internal electrode is provided. An external electrode may include a base layer containing not only a metal, but also co-material particles and other materials to control the sintering temperature of the external electrode and to ensure adhesion of the external electrode to the element body.

If the amount of the co-material particles in the base layer of the external electrode is too small, the thermal stress generated between the external electrode and the element body during sintering cannot be sufficiently alleviated, and cracks may occur in the element body and/or the base layer. On the other hand, if the amount of the co-material particles in the base layer of the external electrode is too large, the uniformity of plating formed on the base layer will be lowered.

Patent Document 1 discloses a method of soldering an external electrode in which an amount of co-material particles in an inside part of a base layer of the external electrode is less than that near the surface of the base layer for reducing cracks and for ensuring adhesion of the solder to the external electrode.

Patent Document 1: JP-A-2000-277371

SUMMARY OF THE INVENTION

However, if the amount of the co-material particles near the surface of the base layer of the external electrode is too small, when sintering is executed to cure the base layer and to integrate the base layer with the element body in a state in which the base layers for adjacent electronic components are in contact with each other, a fusion defect, in which the base layers for different adjacent electronic components stick to one another, may occur.

On the other hand, if the amount of co-material particles near the surface of the base layer of the external electrode is increased to prevent fusion defect in sintering, and if the co-material particles on the surface of the base layer of the external electrode are removed by physical or chemical polishing after sintering to improve the uniformity of plating on the base layer, damage to the element body is large.

It is an object of the present invention to provide an electronic component, a circuit board arrangement, and a method of manufacturing an electronic component that can prevent a decrease in uniformity of plating while minimizing the fusion defect and damage to the element body.

According to an aspect of the present invention, there is provided an electronic component that includes an element body and external electrodes. Each of the external electrodes includes a base layer formed on multiple surfaces of the element body and an electrically-conducting material layer formed on the base layer, the base layer including a metal and co-material particles dispersed in the metal and being connected to the internal electrode. The co-material particles at an interface surface between the base layer and the electrically-conducting material layer have edges covered with the metal at the interface surface. The electrically-conducting material layer is in contact with the co-material particles at the interface surface and the metal covering the edges of the co-material particles at the interface surface.

The metal in the base layer near the interface surface may surround the co-material particles.

The metal at the interface surface may entirely cover the edges of co-material particles at the interface surface.

The length in a cross-section of each co-material particle at the interface surface that is in contact with the electrically-conducting material layer may be in a range from 0.1 μm to 12 μm.

The thickness of pieces of the metal covering the edges of the co-material particles in a cross-section may be in a range from 0.1 μm to 0.7 μm, and the length of the pieces of the metal is in a range from 0.2 μm to 2.5 μm.

The thickness of pieces of the metal covering the edges of the co-material particles in a cross-section may be in a range from 0.2 μm to 0.6 μm, and the length of the pieces of the metal may be in a range from 0.5 μm to 2.0 μm.

The amount of the co-material particles in the base layer may be in a range from 10 wt % to 45 wt %.

The main component of the dielectric and the main component of the co-material particles may have the same composition.

The main component of the co-material particles may be an oxide ceramic.

In the base layer, the ratio of the co-material particles to the metal on a side of the element body may be equal to that on a side of the electrically-conducting material layer.

The main component of the co-material particles may be at least one of barium titanate, strontium titanate, calcium titanate, magnesium titanate, barium strontium titanate, barium calcium titanate, calcium zirconate, barium zirconate, calcium zirconate titanate, and titanium dioxide.

The metal may contain at least one of Cu, Fe, Zn, Al, Ni, Pt, Pd, Ag, Au, and Sn, or an alloy thereof.

The element body may include a laminate including first internal electrode layers and second internal electrode layers arranged alternately in such a manner that the dielectric is interposed therebetween. The external electrodes may include a first external electrode located on a first side surface of the laminate and connected to the first internal electrode layers, and a second external electrode spaced from the first external electrode, located on a second side surface of the laminate opposite to the first side surface, and connected to the second internal electrode layers.

According to another aspect of the present invention, there is provided a circuit board arrangement including a circuit board, and the electronic component mounted on the circuit board. The electronic component is connected to the circuit board via solder layers attached to the electrically-conducting material layer of the electronic component.

According to another aspect of the present invention, there is provided a method of manufacturing an electronic component. The method includes: forming an element body that includes a dielectric and an inner electrode; applying a mixed material, which is obtained by dispersing co-material particles in an electrode material containing a metal, to opposite side surfaces of the element body and peripheral surfaces of the element body adjacent to the side surfaces; sintering the mixed material to form base layers, in which the co-material particles are dispersed in the metal, on the opposite side surfaces and the peripheral surfaces of the element body; oxidizing the metal of the base layers to form an oxide film of the metal on exposed surfaces of the base layers; and blast polishing each of the exposed surfaces of the base layers from directions at oblique angles to the exposed surface of the base layers to remove the oxide film and to raise the metal over edges of the co-material particles that are at the exposed surface; and forming electrical conducting material layers on the base layers, respectively, in such a manner that each electrically-conducting material layer is in contact with the co-material particles and the metal raised over the edges of the co-material particles that were at the exposed surfaces of the corresponding base layer.

The oblique angles to the exposed surface of the base layers may be within a range from 15 to 35 degrees.

According to an aspect of the present invention, it is possible to prevent a decrease in adhesion of plating while minimizing the fusion defect and the damage to the element body.

It is to be understood that both the foregoing general description and the following detailed description are exemplary and explanatory, and are intended to provide further explanation of the invention as claimed.

BRIEF DESCRIPTION OF THE DRAWINGS

FIG. 9 is a graph showing relationships between the amounts of co-material in multilayer ceramic capacitors of working examples, fusion defect rates, and defective plating rates, in which the defective plating rates were examined for working examples with and without blast polishing for a base layer; and FIG. 10 is a table from which FIG. 9 was prepared.

DESCRIPTION OF EMBODIMENTS

Figure 1:
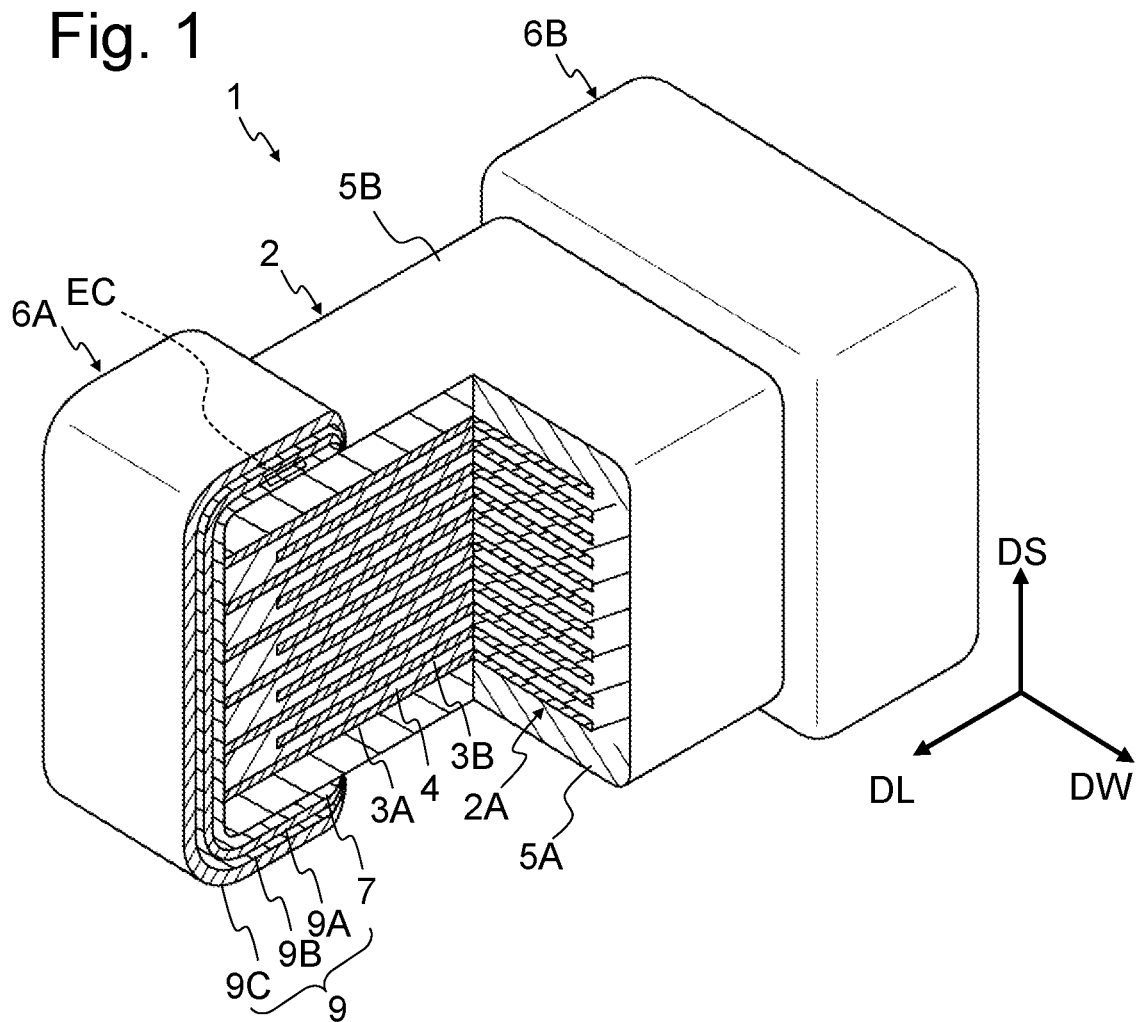
FIG. 1 is a perspective view showing a multilayer ceramic capacitor according to a first embodiment of the present invention.

Embodiments of the present invention will now be described with reference to the accompanying drawings. The following embodiments are not intended to limit the present invention. The combination of all the features described in each of the embodiments is not absolutely necessary for the present invention. The configuration of each embodiment may be modified and/or changed depending upon designs, specifications, and various conditions of an apparatus and a device to which the present invention is applied (use conditions, use environment, and the like). The technical scope of the invention is defined by the appended claims and is not limited by the following embodiments. Furthermore, parts, components, and elements shown in the drawings used in connection with the following description may be different from actual parts, components, and elements in structure, scale, and shape for the sake of easier understanding of the parts, components, and elements.

First Embodiment

Figure 2:
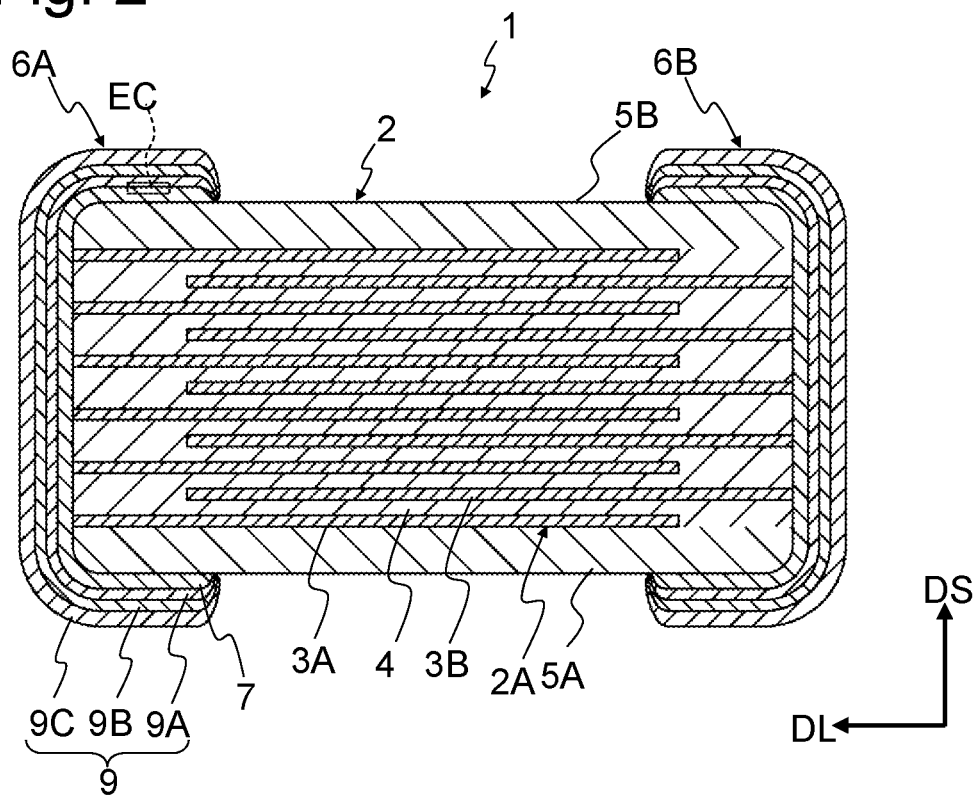
FIG. 2 is a cross-sectional view of the multilayer ceramic capacitor of FIG. 1 taken along the longitudinal direction thereof.

FIG. 1 is a perspective view showing a multilayer ceramic capacitor 1 according to a first embodiment of the present invention. FIG. 2 is a cross-sectional view of the multilayer ceramic capacitor 1 of FIG. 1 taken along the longitudinal direction thereof.

In FIGS. 1 and 2, the multilayer ceramic capacitor 1 includes an element body (element assembly) 2, an external electrode (outer electrode) 6A, and another external electrode (outer electrode) 6B. The element body 2 has a laminate (or a stack) 2A, a lower cover layer 5A, and an upper cover layer 5B. The laminate 2A has internal electrode layers (inner electrode layers) 3A, other internal electrode layers 3B, and dielectric layers 4 interposed between neighboring internal electrode layers 3A and 3B.

The lowermost layer of the laminate 2A is covered with the lower cover layer 5A, and the uppermost layer of the laminate 2A is covered with the upper cover layer 5B. The internal electrode layers 3A and 3B are alternately stacked in such a manner that the dielectric layers 4 are interposed therebetween. The shape of the element body 2 may be a substantially rectangular parallelepiped shape, and the shape of the laminate 2A may also be a substantially rectangular parallelepiped shape. The element body 2 may be chamfered along the respective ridges (edges) of the element body 2. In the following description, the direction perpendicularly passing through the two side surfaces of the element body 2 may be referred to as a longitudinal direction DL, the direction perpendicularly passing through the front and rear surfaces of the element body 2 may be referred to as a width direction DW, and the direction perpendicularly passing through the top and bottom surfaces of the element body 2 may be referred to as a stacking direction DS.

The external electrodes 6A and 6B are located on opposite sides of the element body 2, respectively, so that the external electrodes 6A and 6B are spaced (separated) from each other. Each of the external electrodes 6A and 6B continuously extends from the side surface of the element body 2 to the front and rear surfaces and the top and bottom surfaces.

In the longitudinal direction DL, the internal electrode layers 3A and 3B are arranged alternately at different positions in the laminate 2A. The internal electrode layers 3A can be closer to the left side surface of the element body 2 than the internal electrode layers 3B, whereas the internal electrode layers 3B can be closer to the right side surface of the element body 2 than the internal electrode layers 3A. Left ends of the internal electrode layers 3A are exposed from the left ends of the dielectric layers 4 at the left side surface in the longitudinal direction DL of the element body 2 and are connected to the external electrode 6A. Right ends of the internal electrode layers 3B are exposed from the right ends of the dielectric layers 4 at the right side surface in the longitudinal direction DL of the element body 2 and are connected to the external electrode 6B.

On the other hand, in the width direction DW, which is perpendicular to the longitudinal direction DL perpendicularly passing through the two side surfaces of the element body 2, ends of the internal electrode layers 3A and 3B are covered with the dielectric material that forms the dielectric layers 4. In the width direction DW, both ends of the internal electrode layers 3A may be aligned with both ends of the internal electrode layers 3B.

The outer dimensions of the multilayer ceramic capacitor 1 are, for example, as follows: The length may be 1.0 mm, the width may be 0.5 mm, and the height may be 0.5 mm. The thickness of each of the internal electrode layers 3A, the internal electrode layers 3B, and the dielectric layers 4 in the stacking direction DS may be in a range from 0.05 µm to 5 µm, for example, may be 0.3 µm. The thickness of each of the external electrodes 6A and 6B may be, for example, in a range from 10 µm to 40 µm.

The material of the internal electrode layers 3A and 3B may be a metal, for example, Cu (copper), Ni (nickel), Ti (titanium), Ag (silver), Au (gold), Pt (platinum), Pd (palladium), Ta (tantalum), or W (tungsten), or may be an alloy containing these metals.

The main component of the material of the dielectric layers 4 may be, for example, a ceramic material having a perovskite structure. The main component may be contained in a ratio of 50 at % or more. The ceramic material of the dielectric layers 4 may be, for example, barium titanate, strontium titanate, calcium titanate, magnesium titanate, barium strontium titanate, barium calcium titanate, calcium zirconate, barium zirconate, calcium titanate zirconate, or titanium oxide.

The main component of the material of the lower cover layer 5A and the upper cover layer 5B may be, for example, a ceramic material. The main component of the ceramic material of the lower cover layer 5A and the upper cover layer 5B may be the same as the main component of the ceramic material of the dielectric layers 4.

Each of the external electrodes 6A and 6B includes a base layer 7 and a plating layer 9, which is an electrically-conducting material layer. The external electrodes 6A and 6B are spaced from each other in the length direction DL and are formed on a plurality of surfaces on the element body 2. More specifically, each of the external electrodes 6A and 6B has five outer surfaces arranged around the element body 2, the five outer surfaces including an outer surface of which the reverse surface is in contact with the end surface of the element body 2 in the longitudinal direction DL. One of the five outer surfaces of each of the external electrodes 6A and 6B is used as a mounting surface that faces and is mounted to a circuit board on which the multilayer ceramic capacitor 1 is mounted. The mounting surface is the bottom surface of each of the external electrodes 6A and 6B on the bottom side of the element body 2.

The base layer 7 is located between the element body 2 and the plating layer 9. The base layer 7 electrically connects the multiple internal electrode layers 3A or 3B to the plating layer 9. The base layer 7 includes a metal as a conductive material. For example, the metal of the base layer 7 can be mainly composed of a metal containing at least one of Cu, Fe (iron), Zn (zinc), Al (aluminum), Ni, Pt, Pd, Ag, Au, and Sn (tin), or an alloy thereof.

The base layer 7 further includes a co-material in particulate form. The co-material reduces the difference in thermal expansion coefficients of the element body 2 and the base layer 7 to alleviate the stress exerted in the base layer 7, and can improve the adhesion of the base layer 7 to the element body 2. The co-material may have the same composition as that of the dielectric layer 4. For example, it can contain a ceramic component that is the same as the main component of the ceramic material of the dielectric layer 4. The co-material may contain a main component that is the same as that for the dielectric layer 4, or a ceramic material different from the material of the dielectric layer 4. In a case in which the co-material contains a ceramic material different from the material of the dielectric layer 4, it is preferable that the difference between the coefficients of thermal expansion of the co-material and dielectric layer 4 be within ±30% of the coefficient of thermal expansion of the dielectric layer 4.

The co-material is mixed with the metal material of the base layer 7, and edges of the co-material particles on the interface surface between the base layer 7 and the plating layer 9 are covered with the metal material of the base layer 7. The metal material in the base layer 7 near the interface surface between the base layer 7 and the plating layer 9 surrounds the co-material particles. The metal material on the interface surface between the base layer 7 and the plating layer 9 covers edges of co-material particles on the interface surface between the base layer 7 and the plating layer 9. In the base layer 7, the ratio of the co-material particles to the metal material on the side of the element body 2 may be equal to that on the side of the plating layer 9.

The base layer 7 may contain a glass component. The glass component is used for densification or the like of the base layer 7. The glass component may be, for example, an oxide of Ba (barium), Sr (strontium), Ca (calcium), Zn, Al, Si (silicon), B (boron), or the like. The base layer 7 is electrically connected to multiple internal electrode layers 3A and 3B exposed at the side surface of the element body 2.

The base layer 7 may include the same metal component as that contained in the element body 2. The metal component contained in the element body 2 may include at least one of Mg, Ni, Cr, Sr, Al, Na, and Fe, and may be, for example, Mg. If the metal component contained in the element body 2 is Mg, the base layer 7 may include a compound of the metal in the base layer 7, the metal contained in the element body 2, and oxygen. For example, the compound included in the base layer 7 contains Ni, Mg, and O.

The plating layer 9 is formed on the base layer 7. The plating layer 9 is in contact with the co-material particles of the base layer 7 and the metal material covering edges of the co-material particles. The main component of the material of the plating layer 9 is, for example, a metal such as Cu, Ni, Al, Zn, and Sn, or an alloy containing at least two of Cu, Ni, Al, Zn, and Sn. The plating layer 9 may be a plating layer of a single metal component or may include a plurality of plating layers of different metal components.

For example, the plating layer 9 may have a three-layer structure, i.e., the plating layer 9 may include a Cu plating layer 9A formed on the base layer 7, an Ni plating layer 9B formed on the Cu plating layer 9A, and an Sn plating layer 9C formed on the Ni plating layer 9B. The Cu plating layer 9A can improve the adhesion of the plating layer 9 to the base layer 7. The Ni plating layer 9B can improve the heat resistance of the external electrodes 6A and 6B during soldering. The Sn plating layer 9C can improve wettability of the solder for the plating layer 9. In each of the external electrodes 6A and 6B, the plating layer 9 electrically conducts to the internal electrode layers 3A or 3B through the base layer 7. In addition, the plating layer 9 electrically conducts to terminals of a circuit board through the solder.

In a case in which the metal component of the base layer 7 is Cu, the Cu plating layer 9A may be omitted. If the Cu plating layer 9A is not formed, the plating layer 9 may have a two-layer structure, i.e., the plating layer 9 may include the Ni plating layer 9B and the Sn plating layer 9C formed on the Ni plating layer 9B.

Figure 3:
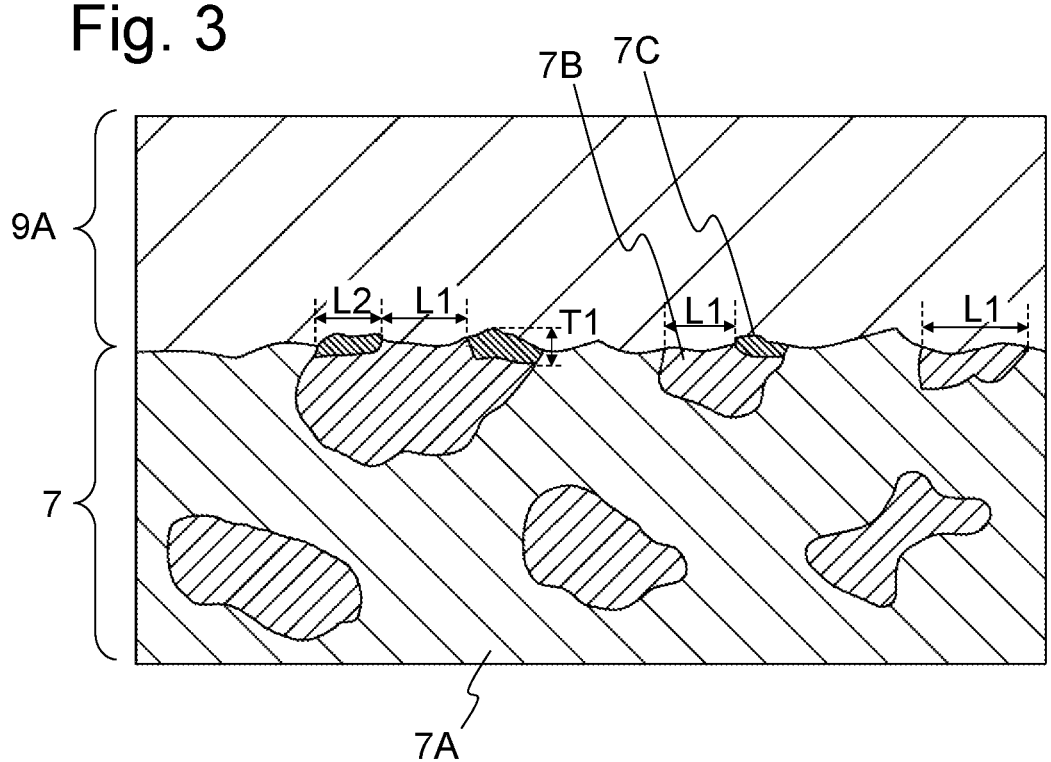
FIG. 3 is an enlarged cross-sectional view of a portion EC in FIG. 1.

FIG. 3 is an enlarged cross-sectional view of a portion EC in FIG. 1.

In FIG. 3, the base layer 7 includes a metal layer 7A, co-material particles 7B, and coating metal pieces 7C. The co-material is mixed in the metal layer 7A and dispersed as co-material particles 7B in the metal layer 7A. Here, the term "particle" is meant to include not only an individual small particle, but also a block formed by a combination of multiple small particles after the sintering process, which will be described later. The coating metal pieces 7C cover edges of the co-material particles 7B located on the interface surface between the base layer 7 and the plating layer 9.

The coating metal pieces 7C can be formed by raising the material of the metal layer 7A over the co-material particles 7B located on the interface surface between the base layer 7 and the plating layer 9. Each coating metal piece 7C can be made continuously around an exposed co-material particle 7B on the surface (which forms the interface surface) by extending the material of the metal layer 7A around the co-material particle 7B to the exposed surface of the co-material particle 7B. The coating metal pieces 7C can be provided on at least part of the peripheries of the surfaces of the co-material particles 7B on the interface surface. The coating metal pieces 7C does not necessarily need to be provided on the surfaces of all of the co-material particles 7B on the interface surface, but can be provided on the surface of some of the co-material particles 7B on the interface surface. For forming the coating metal pieces 7C on the co-material particles 7B on the surface of the base layer 7, blast polishing can be applied to the surface of the base layer 7 from directions at inclined angles thereto. The Cu plating layer 9A is formed on the base layer 7. The Cu plating layer 9A can be in contact with the metal layer 7A, the co-material particles 7B, and the coating metal pieces 7C.

By providing the coating metal pieces 7C on the interface surface between the base layer 7 and the plating layer 9 to cover edges of the co-material particles 7B, the area ratio of the co-material particles 7B exposed at the interface surface between the base layer 7 and the Cu plating layer 9A can be reduced while avoiding reduction of the ratio of the co-material particles 7B in the base layer 7. Therefore, the uniformity of the Cu plating layer 9A on the base layer 7 can be improved while minimizing the difference in thermal expansion coefficients of the element body 2 and the base layer 7. Accordingly, wettability of the solder for each of the external electrodes 6A and 6B can be improved while minimizing damage to the element body 2 caused by the difference in thermal expansion coefficients during the sintering process of forming the base layer 7 on the element body 2.

In addition, it is no longer necessary to remove the co-material particles 7B on the exposed surface of the base layer 7 to improve the uniformity of the Cu plating layer 9A on the base layer 7. Accordingly, it is no longer necessary to perform physical and chemical polishing of the base layer 7 for removing the co-material particles 7B on the exposed surface of the base layer 7 before plating, so that damage to the element body 2 in the plating pretreatment can be reduced.

After the sintering process of forming the base layer 7 on the element body 2, the coating metal pieces 7C on the surface of the base layer 7 can be formed before forming the Cu plating layer 9A on the base layer 7. Accordingly, even when the sintering is executed in a state in which the base layers 7 for adjacent electronic components are in contact with each other, the contact area between the co-material particles 7B of base layers 7 of different electronic components can be increased, so that fusion defect in which the base layers 7 for adjacent electronic components stick together can be reduced.

The length L1 on the cross-section in which each co-material particle 7B on the interface surface between the base layer 7 and the Cu plating layer 9A is in contact with the Cu plating layer 9A is preferably in a range from 0.1 μm to 12 μm. By setting the length L1 to 0.1 μm or more, it is possible to prevent the fusion defect and to minimize the amount of polishing in blast polishing for raising the coating metal pieces 7C over edges of the co-material particles 7B, thereby reducing damage to the element body 2. In addition, by setting the length L1 to 12 μm or less, it is possible to prevent the Cu plating layer 9A from being punctured by the co-material particles 7B and to ensure continuity of the Cu plating layer 9A on the base layer 7.

The thickness T1 of the coating metal pieces 7C on the cross-section is preferably in a range from 0.1 μm to 0.7 μm, and the length L2 of the coating metal pieces 7C is preferably in a range from 0.2 μm to 2.5 μm. By setting the thickness T1 to 0.1 μm or more and the length L2 to 0.2 μm or more, the adhesion of the Cu plating layer 9A to the base layer 7 can be improved. By setting the thickness T1 to 0.7 μm or less and the length L2 to 2.5 μm or less, the amount of polishing in blast polishing for raising the coating metal pieces 7C over edges of the co-material particles 7B can be reduced, thereby reducing damage to the element body 2.

It is more preferable that the thickness T1 of the coating metal pieces 7C on the cross-section be in a range from 0.2 μm to 0.6 μm, and that the length L2 be in a range from 0.5 μm to 2.0 μm. By setting the thickness T1 to 0.2 μm or more and the length L2 be 0.5 μm or more, the adhesion of the Cu plating layer 9A to the base layer 7 can be further improved. By setting the thickness T1 to 0.6 μm or less and the length L2 to 2.0 μm or less, the amount of polishing in blast polishing for raising the coating metal pieces 7C over edges of the co-material particles 7B can be further reduced, thereby further reducing damage to the element body 2.

The amount of the co-material particles in the base layer 7 is preferably in a range from 10 wt % to 45 wt %. If the amount of co-material in the base layer 7 is less than 10 wt %, the adhesion of the base layer 7 to the element body 2 is reduced and the above-described fusion defect is increased. If the amount of co-material in the base layer 7 is 45 wt % or more, plating adhesion failure increases. Therefore, by setting the amount of co-material in the base layer 7 within a range from 10 wt % to 45 wt %, defective fusion and plating adhesion failure can be restricted, and the defective fusion rate and the defective plating rate can be brought close to 0%. It is more preferable that the amount of co-material in the base layer 7 be in a range from 15 wt % to 35 wt %, so that the defective fusion rate and the defective plating rate can be made closer to 0%.

Figure 4:
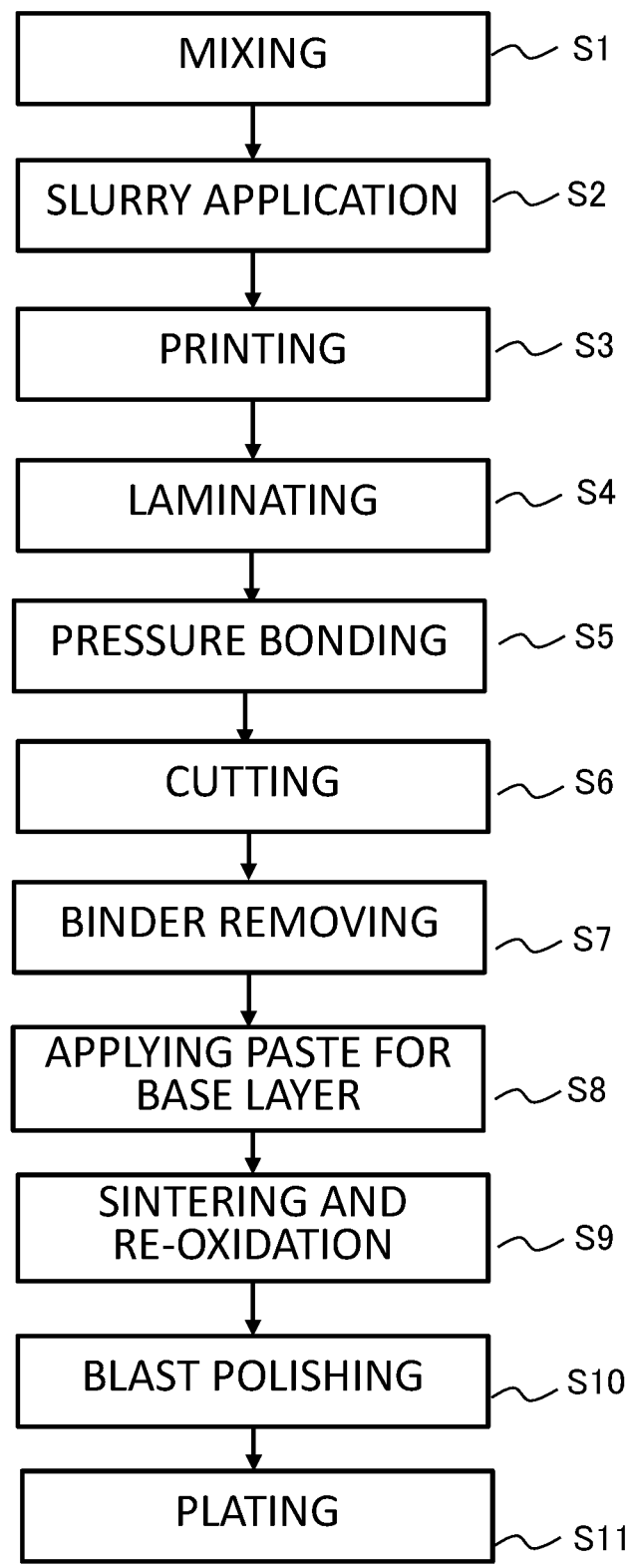
FIG. 4 is a flowchart showing a method of manufacturing a multilayer ceramic capacitor according to the first embodiment.

FIG. 4 is a flowchart showing a method of manufacturing a multilayer ceramic capacitor according to the first embodiment. FIGS. 5A to 5I are cross-sectional views showing an exemplary method of manufacturing the multilayer ceramic capacitor according to the first embodiment. FIG. 6A is an enlarged cross-sectional view of a portion EA in FIG. 5G. FIG. 6B is an enlarged cross-sectional view of a portion EB in FIG. 5H. For the sake of illustration, FIG. 5C to FIG. 5K show only two internal electrode layers 3A and two internal electrode layers 3B laminated alternately in such a manner that the dielectric layers 4 are interposed therebetween.

In Step S1 of FIG. 4 (mixing step), an organic binder and an organic solvent, as a dispersant and a forming aid, are added to a dielectric material powder, and pulverized and mixed to produce a muddy slurry. The dielectric material powder includes, for example, a ceramic powder. The dielectric material powder may include an additive or additives. The additive(s) may be, for example, Mg, Mn, V, Cr, Y, Sm, Eu, Gd, Tb, Dy, Ho, Er, Tm, Yb, Co, Ni, Li, B, Na, K or Si oxide, or glass. The organic binder is, for example, a polyvinyl butyral resin or a polyvinyl acetal resin. The organic solvent is, for example, ethanol or toluene.

Figure 5A:
FIG. 5A is a cross-sectional view used for describing the method of manufacturing the multilayer ceramic capacitor according to the first embodiment.
Figure 6A:
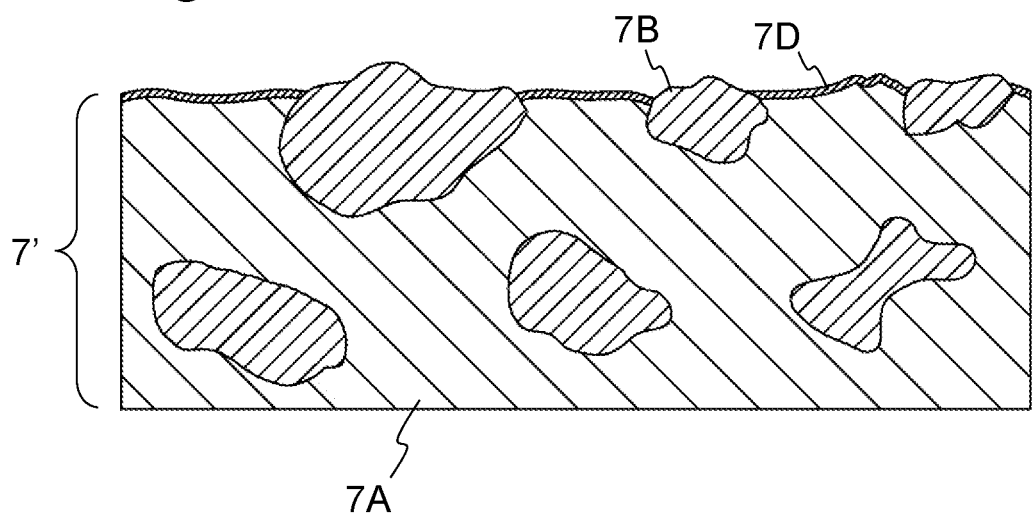
FIG. 6A is an enlarged cross-sectional view of a portion EA in FIG. 5G.
Figure 6B:
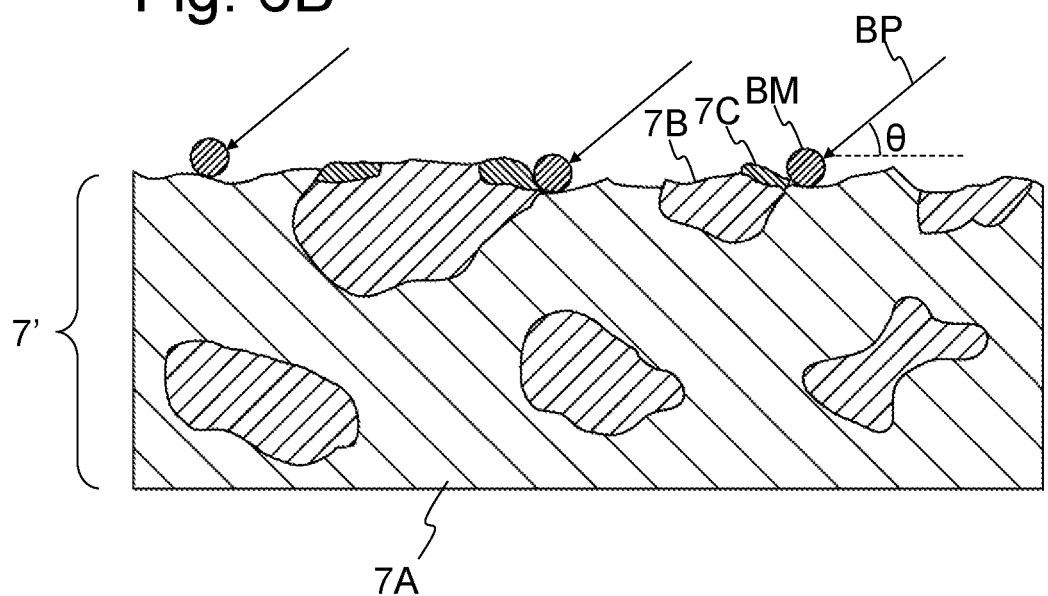
FIG. 6B is an enlarged cross-sectional view of a portion EB in FIG. 5H.

Next, in Step S2 of FIG. 4 (slurry application step), as shown in FIG. 5A, a green sheet 24 is manufactured. Specifically, the slurry containing the ceramic powder is applied onto a carrier film in a sheet form and dried to manufacture the green sheet 24. The carrier film is, for example, a PET (polyethylene terephthalate) film. The application of the slurry is conducted with the use of, for example, a doctor blade method, a die coater method, or a gravure coater method. Step S2 is repeated to prepare a plurality of green sheets 24.

Figure 5B:
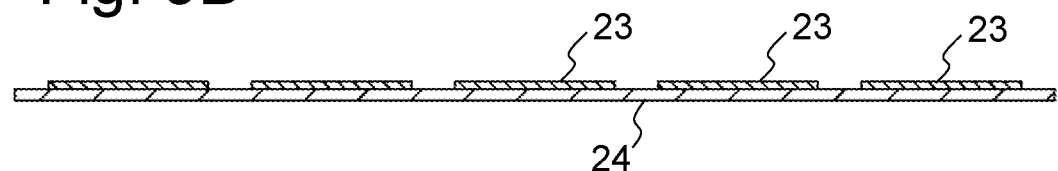
FIG. 5B is another cross-sectional view used for describing the method of manufacturing the multilayer ceramic capacitor according to the first embodiment.

Next, in Step S3 of FIG. 4 (printing step), as shown in FIG. 5B, a conductive paste, which will become an internal electrode layer, is applied in a predetermined pattern onto each of the green sheets 24, on which internal electrode layers 3A or 3B shown in FIG. 1 are to be placed, among the green sheets prepared in Step S1 to form internal electrode patterns 23 on the green sheets 24. In Step S3, it is possible to form a plurality of internal electrode patterns 23 on each single green sheet 24 such that the internal electrode patterns 23 are separated from each other in the longitudinal direction of the green sheet 24.

The conductive paste for the internal electrode layers includes a powder of the metal used as the material of the internal electrode layers 3A and 3B. For example, if the metal used as the material of the internal electrode layers 3A and 3B is Ni, the conductive paste for the internal electrode layers includes a powder of Ni. The conductive paste for the internal electrode layers also includes a binder, a solvent, and, if necessary, an auxiliary agent. The conductive paste for the internal electrode layers may include, as a co-material, a ceramic material having a main component that has the same composition as that of the main component of the dielectric layers 4.

The application of the conductive paste for the internal electrode layers may be conducted with the use of a screen printing method, an inkjet printing method, or a gravure printing method. Thus, Step S3 may be referred to as a printing step. In this manner, a plurality of green sheets 24 that have the internal electrode patterns 23 thereon are prepared.

Figure 5C:
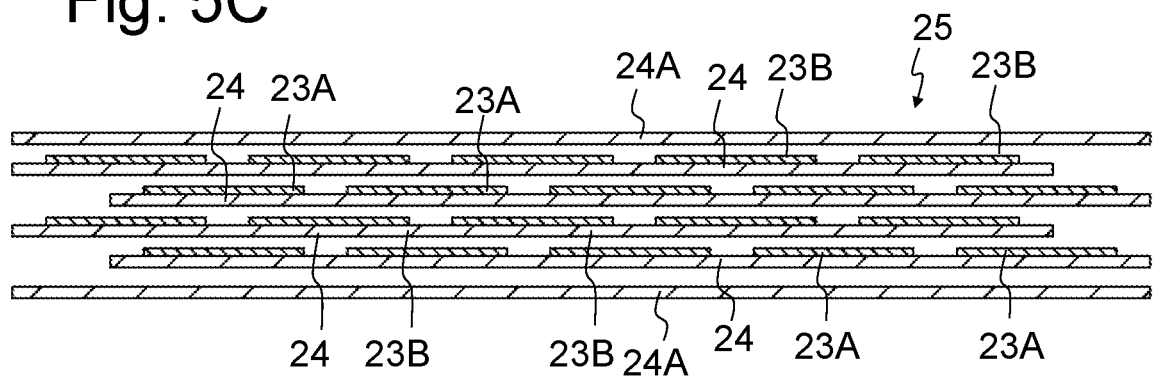
FIG. 5C is still another cross-sectional view used for describing the method of manufacturing the multilayer ceramic capacitor according to the first embodiment.

Next, in Step S4 of FIG. 4 (laminating step), as shown in FIG. 5C, the green sheets 24 on which the internal electrode patterns 23 are formed and the green sheets 24A on which the internal electrode patterns 23 are not formed are laminated in a predetermined order to create a block 25 of the green sheets. The green sheets 24A on which the internal electrode patterns 23 are not formed are used as the outer layers (the lower cover layer 5A and the upper cover layer 5B). In Step S4, the green sheets 24 having the internal electrode patterns 23A or 23B thereon are classified into two groups, i.e., the green sheets 24 having the internal electrode patterns 23A (which will form the internal electrode layer 3A) thereon and the green sheets 24 having the internal electrode patterns 23B (which will form the internal electrode layer 3B) thereon. The green sheets 24 having the internal electrode patterns 23A thereon and the green sheets 24 having the internal electrode patterns 23B thereon are stacked alternately in the laminating direction such that the internal electrode patterns 23A on the green sheet 24 and the internal electrode patterns 23B on the next or adjacent green sheet 24 are alternately shifted in the longitudinal direction of the green sheet 24. Furthermore, three types of portions are defined in the green sheet block 25. Specifically, the green sheet block 25 includes a portion in which only the internal electrode patterns 23A are stacked in the stacking direction, a portion in which the internal electrode patterns 23A and 23B are stacked alternately in the stacking direction, and a portion in which only the internal electrode patterns 23B are stacked in the stacking direction.

Figure 5D:
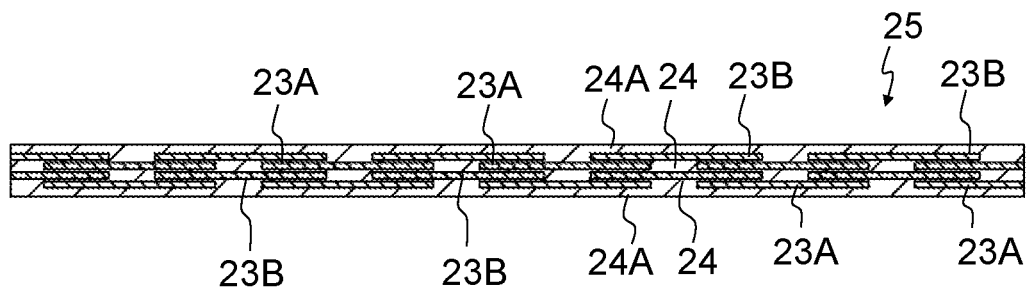
FIG. 5D is yet another cross-sectional view used for describing the method of manufacturing the multilayer ceramic capacitor according to the first embodiment.

Next, in Step S5 of FIG. 4 (pressure bonding step), as shown in FIG. 5D, the laminate block 25 obtained in the laminating step of Step S4 of FIG. 4 is pressed such that the green sheets 24 are pressure-bonded. Pressing the laminate block 25 may be conducted by, for example, sandwiching the laminate block 25 between resin films, and hydrostatically pressing the laminate block 25.

Figure 5E:
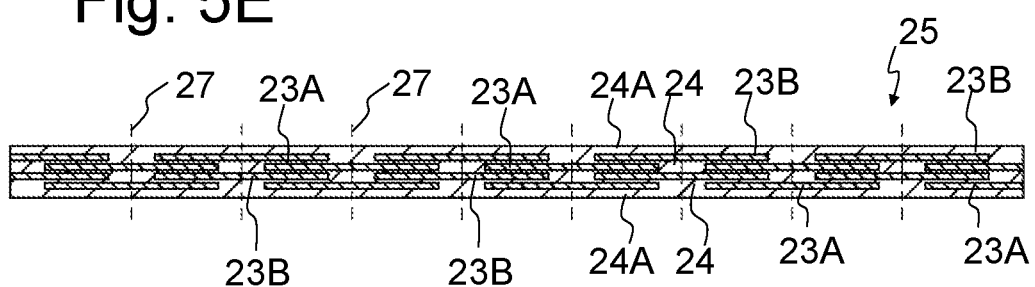
FIG. 5E is another cross-sectional view used for describing the method of manufacturing the multilayer ceramic capacitor according to the first embodiment.

In Step S6 of FIG. 4 (cutting step), as shown in FIG. 5E, the pressed laminate block 25 is cut such that the block 25 is separated into a plurality of element bodies, each of which has a rectangular parallelepiped shape. Each element body has six surfaces. The cutting of the laminate block 25 is conducted at the portions in which only the internal electrode patterns 23A are stacked in the stacking direction, and the portions in which only the internal electrode patterns 23B are stacked in the stacking direction, as indicated by a plurality of vertical broken lines 27. The cutting of the laminate block 25 is conducted by, for example, blade dicing or a similar method. The resulting element bodies 2 are shown in FIG. 5F.

Figure 5F:
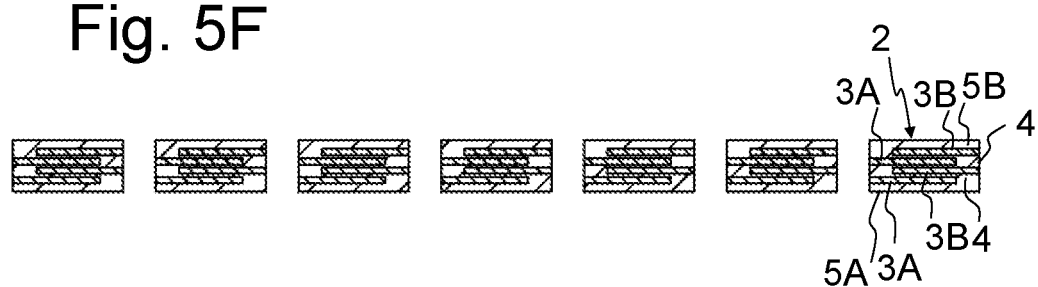
FIG. 5F is another cross-sectional view used for describing the method of manufacturing the multilayer ceramic capacitor according to the first embodiment.

As illustrated in FIG. 5F, the internal electrode layers 3A and 3B are alternately laminated in such a manner that the dielectric layers 4 are interposed therebetween in each of the individual element bodies 2. The internal electrode layers 3A are exposed on one side surface of each element body 2, and the internal electrode layers 3B are exposed on the other side surface of each element body 2.

Next, in Step S7 of FIG. 4 (binder removing step), the binder contained in each of the element bodies 2 obtained in Step S6 of FIG. 4 is removed. The removal of the binder is conducted by, for example, heating the element bodies 2 in an $N_2$ atmosphere at about 350 degrees Celsius.

Next, in Step S8 of FIG. 4 (step of applying a paste for the base layer), a conductive paste for the base layer (underlayer) 7 is applied to both side surfaces of each element body 2 from which the binder is removed in Step S7 of FIG. 4 and to those edges of the remaining four surfaces of the element body 2 which are in contact with the respective side surfaces. Then, the conductive paste is dried. The conductive paste for the base layer 7 includes a powder or filler of the metal used as the conductive material of the base layer 7. For example, when the metal used as the conductive material of the base layer 7 is Ni, the conductive paste for the base layer includes a powder or filler of Ni. The conductive paste for the base layer also includes, as the co-material, a ceramic component, which is the main component of the dielectric layers 4, for example. Particles of oxide ceramics mainly composed of barium titanate (0.8 μm to 4 μm in D50 particle diameter), for example, are mixed in the conductive paste for the base layer, as the co-material, in a range from 10 wt % to 40 wt %. The conductive paste for the base layer further includes a binder and a solvent.

Figure 5G:
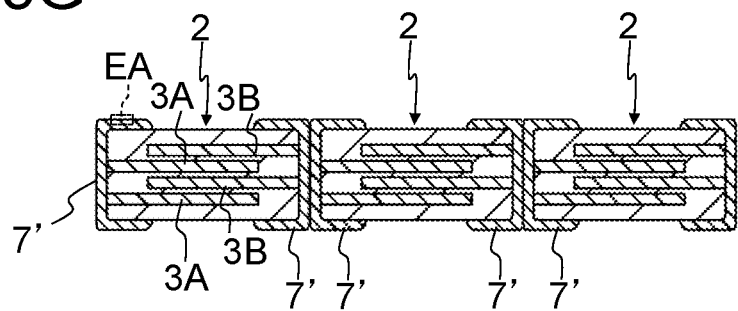
FIG. 5G is another cross-sectional view used for describing the method of manufacturing the multilayer ceramic capacitor according to the first embodiment.

Next, in Step S9 of FIG. 4 (sintering and re-oxidation step), as shown in FIG. 5G, the element bodies 2, on which the conductive paste for the base layer is applied in Step S8 of FIG. 4, undergo the sintering process such that the internal electrode layers 3A and 3B are integrated with the dielectric layers 4 in each element body 2 and the base layers 7 are cured and integrated with the element body 2. The sintering of the element bodies 2 is conducted in, for example, a sintering furnace in a temperature range from 1000 degrees Celsius to 1350 degrees Celsius for ten minutes to two hours.

If a base metal such as Ni or Cu is used as the material of the internal electrode layers 3A and 3B, the sintering process may be conducted in the sintering furnace while the interior of the sintering furnace is kept to a reducing atmosphere in order to prevent oxidation of the internal electrode layers 3A and 3B.

Then, the ceramic material in the element bodies 2 and the base layers 7 reduced in the sintering process is re-oxidized in an oxidation atmosphere. At the same time, the metal exposed on the surface of each base layer 7' is oxidized to form an oxide film of the metal on the exposed surface of the base layer 7'. It is possible to perform the re-oxidation treatment at 600 degrees Celsius to 1000 degrees Celsius in an $N_2$ gas atmosphere, for example.

The base layer 7' corresponds to the base layer before the coating metal pieces 7C in FIG. 3 is formed, as shown in FIG. 6A. In the base layer 7', the co-material particles 7B near the surface of the base layer 7' protrude from the surface of the base layer 7'. Therefore, the flatness of the surface of the base layer 7' is inferior to that of the base layer 7. An oxide film 7D of the metal layer 7A is formed on the metal layer 7A exposed on the surface of the base layer 7'.

Figure 5H:
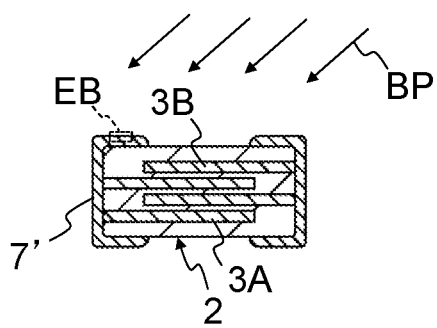
FIG. 5H is another cross-sectional view used for describing the method of manufacturing the multilayer ceramic capacitor according to the first embodiment.

Next, in S10 of FIG. 4 (blast polishing step), as shown in FIG. 5H, in the blast polishing process, the oxide film 7D on the base layer 7' is removed by blast polishing BP from directions at oblique angles to the exposed surface of the base layer 7', and the material of the metal layer 7A is raised over the co-material particles 7B on the exposed surface of the base layer 7' to form the coating metal pieces 7C.

In blast polishing BP, as shown in FIG. 6B, the element body 2 is deployed in a blast processing apparatus so that the base layers 7' are exposed, and blast media BM are projected from directions at oblique angles to each surface of the base layer 7'. The oblique angles θ with respect to the projection surface of the base layer 7' are preferably within a range from 15 to 35 degrees. When the blast media BM obliquely collide with the metal layer 7A around the co-material particles 7B on the surface of the base layer 7, the material of the metal layer 7A is raised over the co-material particles 7B to produce the coating metal pieces 7C above the co-material particles 7B.

For example, the centers of both surfaces of the element body 2 exposed from the base layers 7' are fixed with a thin flat jig, and blast media BM are projected from various directions through a nozzle that is moved freely with respect to the base layers 7', so that the surfaces of the base layers 7' exposed in all directions are polished. In this way, coating metal pieces 7C can be formed at one time on co-material particles 7B on different exposed surfaces of each of the external electrodes 6A and 6B in FIG. 1. The blasting media BM are, for example, particles made of zircon or alumina.

Adjustable projection conditions include the projection speed, projection amount, projection area, and projection angles. The projection speed is adjusted by adjusting the pressure and path of the blast media BM. The projection volume is adjusted by adjusting the media circulation path and the projection time. The projection area is adjusted by adjusting the nozzle shape and the distance between the element body 2 and the nozzle. The projection angle is adjusted by adjusting the nozzle angle so that it is within a range from 15 degrees to 35 degrees with respect to each projection surface.

Figure 5I:
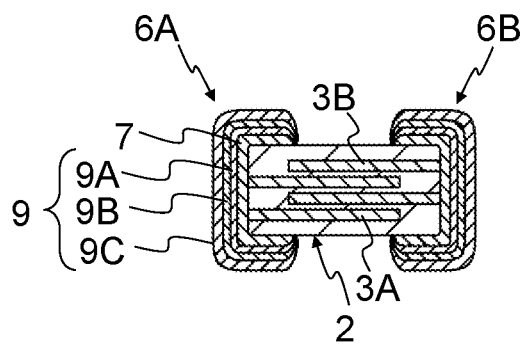
FIG. 5I is another cross-sectional view used for describing the method of manufacturing the multilayer ceramic capacitor according to the first embodiment.

Next, in S11 of FIG. 4 (plating step), as shown in FIG. 5I, the plating layers 9 are formed on the base layers 7 in which the coating metal pieces 7C are formed above the co-material particles 7B. In forming the plating layer 9, for example, Cu plating, Ni plating, and Sn plating can be performed sequentially. The plating layer 9 can be formed by that the element body 2, on which the base layers 7 are formed, is housed in a barrel and immersed in the plating solution together with the barrel, and the barrel is rotated and energized.

The material of the plating layer 9 is placed even on the entirety of the exposed surface of each of the exposed co-material particles 7B by virtue of the coating metal pieces 7C on the exposed co-material particles 7B. Therefore, the plating layer 9 can be prevented from being punctured by the exposed co-material particles 7B on the surface of the base layer 7, and the continuity of the plating layer 9 formed on the base layer 7 can be ensured. Accordingly, the plating layer 9 can be in contact with the metal layer 7A, the exposed co-material particles 7B, and the coating metal pieces 7C.

As described above, according to the first embodiment, by performing blast polishing BP from directions at oblique angles with respect to the projection surface of the base layer 7', the metal layer 7A can be raised over the exposed co-material particles 7B on the surface of the base layer 7' while removing the oxide film 7D on the metal layer 7A. Therefore, it is possible to cause the plating layer 9 to be in contact with the metal layer 7A and to reduce the contact area between the plating layer 9 and the exposed co-material particles 7B without removing the co-material particles 7B existing on the surface of the base layer 7'. As a result, it is possible to improve the adhesion of the plating layer 9 to the base layer 7 while preventing a decrease in throughput, and at the same time, it is possible to reduce the above-described fusion defect in which the base layers 7' for adjacent multilayer ceramic capacitors 1 stick together when the sintering is executed for the base layers 7' and to reduce damage to the element.

Second Embodiment

Figure 7:
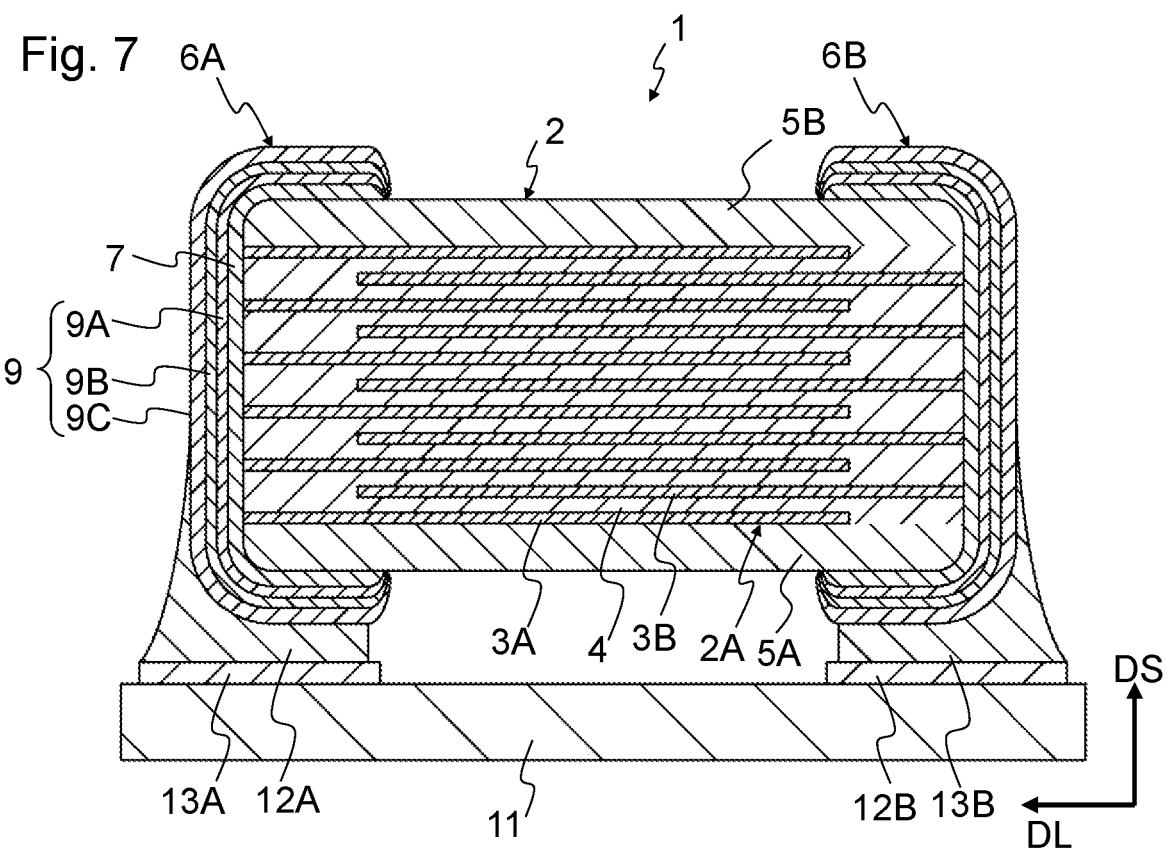
FIG. 7 is a cross-sectional view showing a circuit board arrangement in which a multilayer ceramic capacitor is mounted to a circuit board according to a second embodiment.

FIG. 7 is a cross-sectional view showing a circuit board arrangement according to a second embodiment of the present invention, on which a multilayer ceramic capacitor is mounted. The circuit board arrangement includes a circuit board 11 and a multilayer ceramic capacitor 1 mounted on the circuit board 11.

As shown in FIG. 7, land electrodes 12A and 12B are formed on the circuit board 11. The circuit board 11 may be a printed circuit board or a semiconductor board formed of, for example, Si. The multilayer ceramic capacitor 1 is connected to the land electrodes 12A and 12B via solder layers 13A and 13B attached to the Sn plating layers 9C and 9C of the external electrodes 6A and 6B, respectively.

Since the plating layer 9 is in contact with not only the metal layer 7A of the base layer 7, but also with the coating metal pieces 7C, the continuity of the plating layer 9 on the base layer 7 can be improved. Accordingly, wettability of each of the solder layers 13A and 13B to the plating layer 9 can be improved, and the reliability of the multilayer ceramic capacitor 1 can be maintained even after being mounted on the circuit board 11.

In the base layer 7, since the ratio of the co-material particles to the metal material on the side of the element body 2 is substantially equal to that on the side of the plating layer 9, the resistance of the base layer 7 to thermal history can be improved.

As described above, according to the second embodiment, the plating layer 9 is in contact with not only the metal layer 7A of the base layer 7, but also with the coating metal pieces 7C. Accordingly, the continuity of the plating layer 9 on the base layer 7 can be improved without removing the co-material existing on the surface of the base layer 7, and the reliability of the circuit board arrangement, which includes the multilayer ceramic capacitor 1, can be improved.

Third Embodiment

Figure 8:
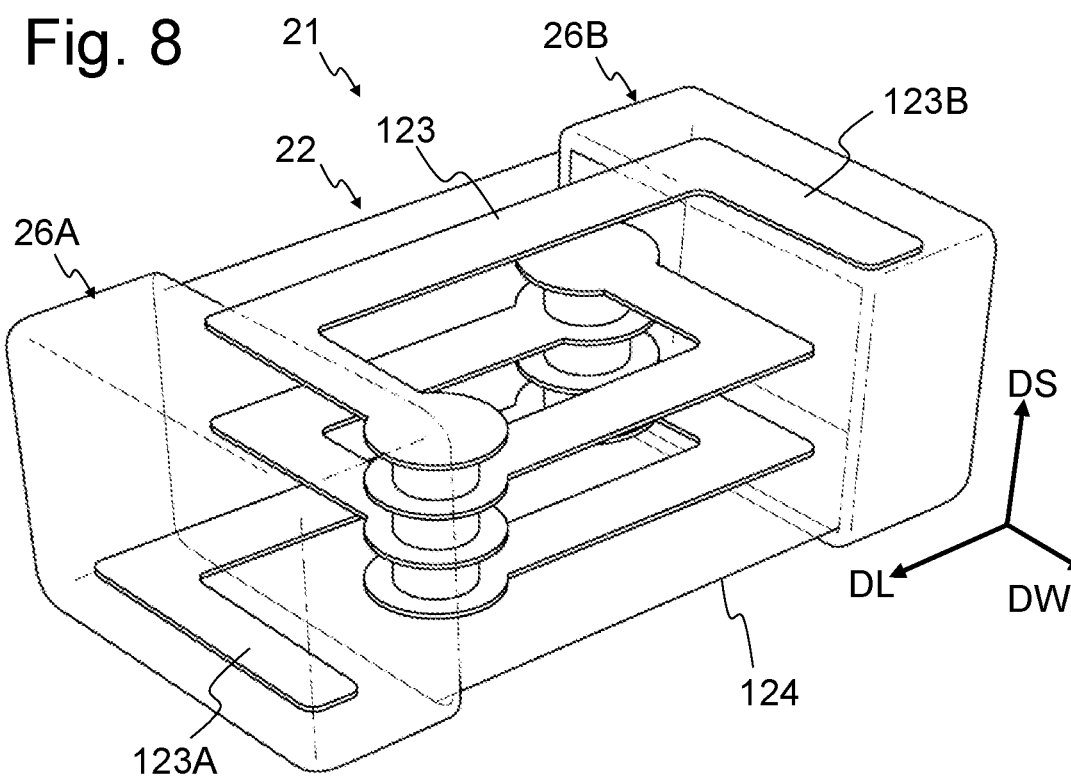
FIG. 8 is a perspective view showing an electronic component according to a third embodiment.

FIG. 8 is a perspective view showing an electronic component according to a third embodiment. In FIG. 8, a chip inductor is taken as an example as an electronic component.

The chip inductor 21 includes an element body 22 and two external electrodes 26A and 26B. The element body 22 includes a coil pattern 123 that includes two terminal segments 123A and 123B formed at both ends thereof and a magnetic material 124. The shape of the element body 22 may be a substantially rectangular parallelepiped shape.

The external electrodes 26A and 26B are located on opposite sides of the element body 22, respectively, so that the external electrodes 26A and 26B are spaced (separated) from each other. Each of the external electrodes 26A and 26B continuously extends from the side surface of the element body 22 to the front and rear surfaces and the top and bottom surfaces.

The coil pattern 123 is covered with magnetic material 124. However, the terminal segment 123A is exposed from the magnetic material 124 on one side of the element body 22 and is connected to the external electrode 26A, whereas the terminal segment 123B is exposed from the magnetic material 124 on the other side of the element body 22 and is connected to the external electrode 26B.

The material of the coil pattern 123 and the terminal segments 123A and 123B may be, for example, a metal such as Cu, Ni, Ti, Ag, Au, Pt, Pd, Ta, and W, or an alloy containing at least one of these metals. The magnetic material 124 is, for example, a ferrite.

Each of the external electrodes 26A and 26B can be configured in the same manner as that of the external electrodes 6A and 6B in FIG. 1. In other words, each of the external electrodes 26A and 26B has a base layer and a plating layer. The base layer contains a metal material and co-material particles. The co-material particles are mixed with and dispersed in the metal of the base layer, and edges of the co-material particles that exist on the surface of the base layer are covered with the metal of the base layer.

As described above, according to the third embodiment, the contact area between the plating layer of each of the external electrodes 26A and 26B and the co-material particles can be reduced without removing the co-material on the surface of the base layer of each of the external electrodes 26A and 26B. As a result, it is possible to prevent a decrease in the uniformity of the plating layers of the external electrodes 26A and 26B. In addition, it is possible to reduce the above-described fusion defect in which the base layers for adjacent chip inductors 21 stick together when the sintering is executed for the base layers and to reduce damage to the element body 22.

In the above-described embodiments, the multilayer ceramic capacitor 1 and the chip inductor are taken as examples as electronic components, but the electronic components may include a chip resistor or a sensor chip. In the above-described embodiments, each of the electronic components includes two external electrodes, but the electronic component may include three or more external electrodes.

Working Examples

FIG. 9 is a graph showing relationships between the amounts of co-material in multilayer ceramic capacitors of working examples, fusion defect rates, and defective plating rates, in which the defective plating rates were examined for working examples with and without blast polishing of the base layer 7. FIG. 10 is a table from which FIG. 9 was prepared.

In the case in blast polishing was not conducted for the base layer 7, the surface of the base layer was treated by chemical polishing. In experiments for FIGS. 9 and 10, the metal of the base layer 7 was Ni. The amount of the co-material particles in the base layer 7 is shown in wt % in FIGS. 9 and 10.

FIG. 10 also shows the ratio of the total length of the co-material particles 7B in contact with the plating layer 9 to the length of the interface surface between the base layer 7 and the plating layer 9. The total length of the co-material particles 7B in contact with the plating layer 9 was the sum of the lengths L1 of all co-material particles 7B on the interface surface (see FIG. 3) in the external electrodes 6A and 6B in one cross-section shown in FIG. 2. The length of the interface surface between the base layer 7 and the plating layer 9 was the sum of the lengths of the interface surface between the base layer 7 and the plating layer 9 in the external electrodes 6A and 6B in the cross-section. The ratio was calculated for five samples of the multilayer ceramic capacitors 1 and the average is used in FIG. 10.

The fusion defect is that the base layers 7 for adjacent multilayer ceramic capacitors 1 stick together after the sintering is executed in a state in which the base layers 7 for multiple multilayer ceramic capacitor 1 are in contact with one another as shown in FIG. 5G A cross-section shown in FIG. 5G was observed to detect the fusion defect in a series of the element bodies 2, and the fusion defect rate was calculated based on the observation.

The defective plating is the plating adhesion failure of the base layer 7 and the plating layer 9. A cross-section shown in FIG. 2 was observed to detect the defective plating, and the defective plating rates were calculated as the average for five samples of the multilayer ceramic capacitors 1 based on the observation.

The experiments were conducted for the samples within a range from 10% to 70% of the amount of co-material in the base layer 7. There was Ni layer coating on edge of the co-material particles on the interface surface between the base layer 7 and the plating layer 9 when blast polishing was conducted for the base layer 7, whereas there was no Ni layer coating on edge of the co-material particles when blast polishing was not conducted for the base layer 7. Accordingly, the blast polishing treatment is effective to coat the edge of the co-material particles on the interface surface between the base layer 7 and the plating layer 9 with the Ni coating metal pieces 7C.

As the amount of co-material in the base layer 7 increases, the total length of the co-material particles 7B in contact with the plating layer 9 increases, regardless of whether blast polishing was conducted or not, resulting in an increase in the ratio of the total length of the co-material particles 7B in contact with the plating layer 9 to the length of the interface surface between the base layer 7 and the plating layer 9. However, in the case in which blast polishing was conducted, the total length of the co-material particles 7B in contact with the plating layer 9 increases was less than in the case in which blast polishing was not conducted, so that the ratio of the total length of the co-material particles 7B in contact with the plating layer 9 to the length of the interface surface between the base layer 7 and the plating layer 9 in the case in which blast polishing was conducted is less than that in the case in which blast polishing was not conducted.

Accordingly, as shown in FIGS. 9 and 10, as the amount of co-material in the base layer 7 increases, the contact area between the metal in the base layer 7 and the plating layer 9 decreases, regardless of whether blast polishing was conducted or not, resulting in that the defective plating rate increases. However, in the case in which blast polishing was conducted, the contact area between the metal in the base layer 7 and the plating layer 9 was larger than that in the case in which blast polishing was not conducted, so that the defective plating rate in the case in which blast polishing was conducted is remarkably less than that in the case in which blast polishing was not conducted.

In addition, as shown in FIGS. 9 and 10, as the amount of co-material in the base layer 7 increases, the fusion defect rate after sintering decreases. Accordingly, increasing the amount of co-material in the base layer 7 is effective to reduce the fusion defect rate. Since sintering was performed before blast polishing, the fusion defect rate in the case in which blast polishing was conducted is equal to that in the case in which blast polishing was not conducted.

According to the above results, in the case in which blast polishing was conducted, by setting the amount of co-material in the base layer 7 within a range from 10% to 45%, it is possible to restrict the fusion defect rate and the plating failure rate to almost 0%. However, it is contemplated that the plating failure rate may vary depending on the blast polishing conditions. Accordingly, it is preferable to set the amount of co-material in the base layer 7 as low as possible so that the fusion defect rate is 0%, and then to set the blast polishing conditions so that the plating failure rate is 0%.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An electronic component comprising:
    an element body comprising a dielectric and an internal electrode, and
    external electrodes each comprising a base layer formed on multiple surfaces of the element body and an electrically-conducting material layer formed on the base layer, the base layer comprising a metal and co-material particles dispersed in the metal and being connected to the internal electrode,
    wherein the co-material particles at an interface surface between the base layer and the electrically-conducting material layer have edges covered with the metal at the interface surface, and the electrically-conducting material layer is in contact with the co-material particles at the interface surface and the metal covering the edges of the co-material particles at the interface surface.

2. The electronic component according to claim 1, wherein the metal in the base layer near the interface surface surrounds the co-material particles.

3. The electronic component according to claim 1, wherein the metal at the interface surface entirely covers the edges of co-material particles at the interface surface.

4. The electronic component according to claim 1, wherein a length in a cross-section of each co-material particle at the interface surface that is in contact with the electrically-conducting material layer is in a range from 0.1 μm to 12 μm.

5. The electronic component according to claim 1, wherein a thickness of pieces of the metal covering the edges of the co-material particles in a cross-section is in a range from 0.1 μm to 0.7 μm, and wherein a length of the pieces of the metal is in a range from 0.2 μm to 2.5 μm.

6. The electronic component according to claim 1, wherein a thickness of pieces of the metal covering the edges of the co-material particles in a cross-section is in a range from 0.2 μm to 0.6 μm, and wherein a length of the pieces of the metal is in a range from 0.5 μm to 2.0 μm.

7. The electronic component according to claim 1, wherein an amount of the co-material particles in the base layer is in a range from 10 wt % to 45 wt %.

8. The electronic component according to claim 1, wherein a main component of the dielectric and a main component of the co-material particles have a same composition.

9. The electronic component according to claim 1, wherein a main component of the co-material particles is an oxide ceramic.

10. The electronic component according to claim 1, wherein, in the base layer, a ratio of the co-material particles to the metal on a side of the element body is equal to that on a side of the electrically-conducting material layer.

11. The electronic component according to claim 1, wherein a main component of the co-material particles is at least one of barium titanate, strontium titanate, calcium titanate, magnesium titanate, barium strontium titanate, barium calcium titanate, calcium zirconate, barium zirconate, calcium zirconate titanate, and titanium dioxide.

12. The electronic component according to claim 1, wherein the metal contains at least one of Cu, Fe, Zn, Al, Ni, Pt, Pd, Ag, Au, and Sn, or an alloy thereof.

13. The electronic component according to claim 1,
wherein the element body comprises a laminate comprising first internal electrode layers and second internal electrode layers arranged alternately in such a manner that the dielectric is interposed therebetween, and
wherein the external electrodes include:
a first external electrode located on a first side surface of the laminate and connected to the first internal electrode layers, and
a second external electrode spaced from the first external electrode, located on a second side surface of the laminate opposite to the first side surface, and connected to the second internal electrode layers.

14. A circuit board arrangement comprising:
a circuit board; and
the electronic component according to claim 1 mounted on the circuit board, the electronic component being connected to the circuit board via solder layers attached to the electrically-conducting material layer of the electronic component.

15. The electronic component according to claim 1, wherein in each of the external electrodes:
an amount of the co-material particles in the base layer is in a range from 10 wt % to 45 wt %,
a length in a cross-section of each co-material particle at the interface surface that is in contact with the electrically-conducting material layer is in a range from 0.1 µm to 12 µm, and
a thickness of pieces of the metal covering the edges of the co-material particles in a cross-section is in a range from 0.1 µm to 0.7 µm, and wherein a length of the pieces of the metal is in a range from 0.2 µm to 2.5 µm.

16. A method of manufacturing an electronic component, the method comprising:
forming an element body that includes a dielectric and an inner electrode;
applying a mixed material, which is obtained by dispersing co-material particles in an electrode material containing a metal, to opposite side surfaces of the element body and peripheral surfaces of the element body adjacent to the side surfaces;
sintering the mixed material to form base layers, in which the co-material particles are dispersed in the metal, on the opposite side surfaces and the peripheral surfaces of the element body;
oxidizing the metal of the base layers to form an oxide film of the metal on exposed surfaces of the base layers; and
blast polishing each of the exposed surfaces of the base layers from directions at oblique angles to the exposed surface of the base layers to remove the oxide film and to raise the metal over edges of the co-material particles that are exposed at the exposed surface; and
forming electrical conducting material layers on the base layers, respectively, in such a manner that each electrically-conducting material layer is in contact with the co-material particles and the metal raised over the edges of the co-material particles that were exposed at the exposed surfaces of the corresponding base layer.

17. The method of manufacturing an electronic component according to claim 16, wherein the oblique angles to the exposed surface of the base layers are within a range from 15 to 35 degrees.

* * * * *